United States Patent [19]

Mostyn, Jr.

[11] Patent Number: 4,501,932

[45] Date of Patent: Feb. 26, 1985

[54] SOLID STATE ELECTRONIC DIAL PULSE RECEIVER CIRCUIT

[75] Inventor: William T. Mostyn, Jr., Waco, Tex.

[73] Assignee: Telco Systems, Inc., Waco, Tex.

[21] Appl. No.: 290,731

[22] Filed: Aug. 6, 1981

[51] Int. Cl.³ .................. H03K 17/60; H04Q 3/04
[52] U.S. Cl. .................. 179/16 AA; 179/16 EA; 307/132 EA; 307/254
[58] Field of Search .......... 179/16 EA, 16 AA, 16 B, 179/18 EB, 18 GD, 18 GC, 90 R; 307/138, 132 E, 132 EA, 247 A, 247 R, 254

[56] References Cited

U.S. PATENT DOCUMENTS

| | | | |
|---|---|---|---|
| 3,458,727 | 7/1969 | Watkins, Jr. | 307/255 |
| 3,594,510 | 7/1971 | Blashfield | 179/16 AA |
| 3,718,771 | 3/1973 | Bank | 179/90 R |
| 3,812,296 | 9/1974 | Paraskevakos | 179/18 B |
| 3,854,012 | 12/1974 | Chambers, Jr. | 179/18 AD |
| 3,870,902 | 3/1975 | Takarada | 307/254 X |
| 3,941,937 | 3/1976 | Gauthier | 179/18 EB |
| 3,985,970 | 10/1976 | Lerault et al. | 179/16 EA |
| 4,322,586 | 3/1982 | Mein et al. | 179/170 NC |
| 4,375,014 | 2/1983 | Horak | 179/16 EA |

Primary Examiner—Thomas W. Brown
Attorney, Agent, or Firm—Glaser, Griggs & Schwartz

[57] ABSTRACT

An electronic switch for use in the tip and ring circuit of a rotary dial telephone pulsing system is disclosed. The electronic switch is a functional replacement for a single pole, double throw electromechanical pulsing relay having normally open and normally closed output terminals, with the state of the output terminals being reversed in response to the connection of an external impedance load to an input sensing node. Normally open and normally closed output nodes are driven by first and second output switching circuits. The operating states of the first and second output switching circuits are reversed in response to a switching signal generated by a binary switch. The binary switch is biased off with no switching signal being produced in the absence of the external impedance load so that one output terminal is normally open and the other output terminal is normally closed. When the external impedance load is connected to the sensing node, the switching signal is generated, thereby reversing the operating states of the output switching circuits.

11 Claims, 3 Drawing Figures

SOLID STATE ELECTRONIC DIAL PULSE RECEIVER CIRCUIT

BACKGROUND OF THE INVENTION

1. Field of the Invention

This invention relates to electronic switching circuits, and in particular to a solid state switching circuit for use in the tip and ring circuit of a rotary dial telephone pulsing system as a functional replacement for a single pole, double throw electromechanical pulsing relay having normally open and normally closed contacts.

2. Description of the Prior Art

A relay is an electric switching device comprising one or more contacts which open or close circuits. In some relays, the switching action is brought about by an electromagnet which closes or opens contacts by means of a movable armature which it attracts or releases.

The switching action of an electromechanical relay is characterized by several factors including mechanical bounce and electrical waveform distortion which occurs in response to the bounce, welding of relay contacts in response to arcing and high current flow, pitting of relay contacts which increases circuit resistance, relatively slow response time, relatively low reliability which gradually diminishes with age, and latching current sensitivity. Moreover, the solenoid of the electromechanical relay introduces a high inductive load within the operating circuit.

The foregoing operating characteristics limit, in some way, the use of the electromechanical relay for various applications.

Telephone exchange equipment is an important application area in which electromechanical relays have played an essential role. When a subscriber dials a number, the circuit to the telephone exchange is interrupted as many times as corresponds to that number. Each digit of the dial controls a selection stage comprising an electromechanical multiple contact stepping switch. The rotary dial pulses are coupled to a stepping relay and a timing relay by means of a single pole, double throw pulsing relay having normally closed and normally open switch contacts. The solenoid of the pulsing relay is energized by the flow of current in the subscriber circuit.

It will be appreciated that the latching current sensitivity of the pulsing relay will be affected by the condition of the telephone equipment, including the subscriber circuit, the telephone transmission lines and power supply regulation. As the equipment grows older, the latching current sensitivity, together with the usual problems of bounce, contact welding, contact pitting, response time and inductive loading, combine to significantly reduce the operating reliability and effectiveness of the rotary dial telephone system.

OBJECTS OF THE INVENTION

There is a continuing interest in improving the operational effectiveness and reliability of equipment which incorporates electromechanical relays. In particular, there is a need for such improvement in rotary dial telephone installations which presently utilize electromechanical switching relays. Accordingly, the principal object of the present invention is to provide an electronic switching circuit for use in a rotary dial telephone system as a functional replacement for a single pole, double throw electromechanical pulsing relay having normally open and normally closed contacts.

A general object of the invention is to provide a solid state switching circuit which is functionally interchangeable with a single pole, double throw electromechanical switch.

Yet another object of the invention is to provide a solid state switching circuit having an input sensing node and normally open and normally closed output nodes, with the state of the output nodes being reversed in response to the connection of an external impedance load to the input sensing node, wherein positive state reversal occurs independently of the magnitude of the external impedance load for external load impedances less than a predetermined maximum operative value.

SUMMARY OF THE INVENTION

According to novel features of the invention, the foregoing objects are provided by a switching circuit having an input sensing node and normally open and normally closed output nodes in which a bistable switch selectively controls first and second output switching circuits in response to the connection and disconnection of an external impedance load to the input sensing node. This switching circuit is a functional replacement for a single pole, double throw electromechanical relay having normally open and normally closed output terminals.

The normally open and normally closed output nodes are driven by the first and second output switching circuits. The operating states of the first and second output switching circuits are reversed in response to a switching signal generated by the binary switch. The binary switch is biased off with no switching signal being produced in the absence of an external impedance load, so that one output terminal is normally open and the other output terminal is normally closed. When an external impedance load whose value is less than a predetermined maximum value is connected to the sensing node, the switching signal is generated, thereby reversing the operating states of the output switching circuits.

The input sensing node is further biased by an input voltage limiter which maintains the sensing node at a predetermined bias voltage level above the operation level of the switching circuit in one of the operating states in response to the connection of an external impedance load to the sensing node.

In a preferred embodiment, the voltage input limiter circuit comprises forward biased diodes which are coupled between a voltage supply node and the sensing node. The voltage drop produced by the forward biased diode remains substantially constant in response to the flow of current through the diode, so that the turn-on bias voltage remains fixed even though the current flowing through the sensing node may vary because of variations in the magnitude of the external impedance load. By this arrangement, positive state reversal occurs independently of the magnitude of the external impedance load, so long as the impedance of the external load is less than the designed maximum operative value, thereby rendering the switching circuit relatively insensitive to the condition of the equipment to which it is attached, and completely overcoming latching current sensitivity limitations.

The novel features which characterize the invention are defined by the appended claims. The foregoing and other objects, advantages and features of the invention will hereinafter appear, and for purposes of illustration of the invention, but not of limitation, an exemplary embodiment of the invention is shown in the appended drawings.

DETAILED DESCRIPTION OF THE PREFERRED EMBODIMENT

In the description which follows, the electronic switch of the invention is described with reference to its use in the tip and ring circuit of a rotary dial telephone pulsing system. Reference to the rotary dial telephone system is for example and illustration only, and it should be understood that the switching circuit of the invention can be used to good advantage in other applications as a functional replacement for a single pole, double throw electromechanical switch or relay.

Figure 1:
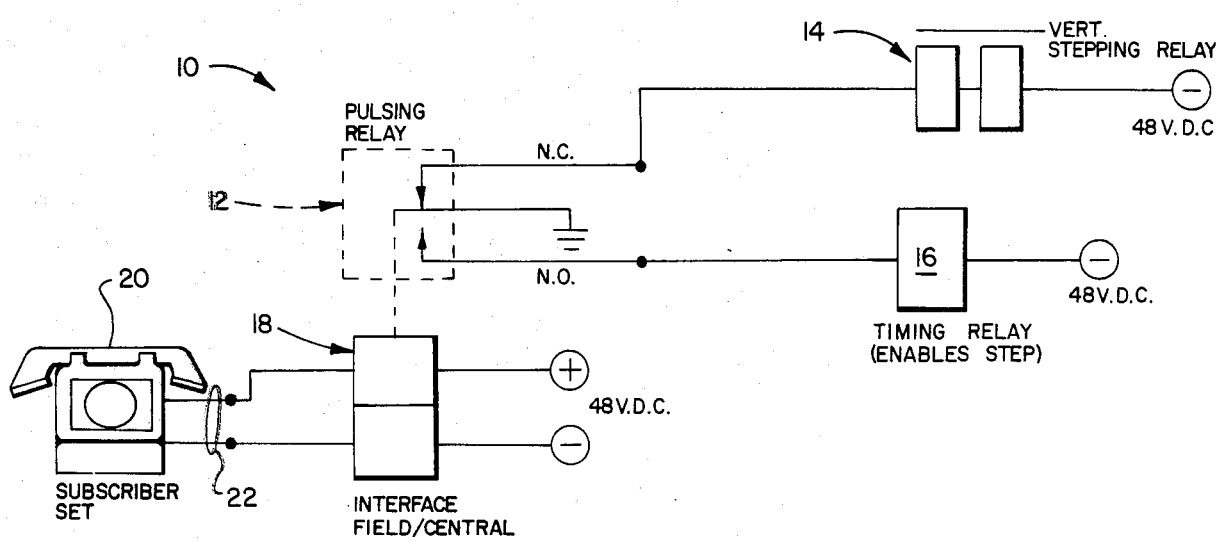
FIG. 1 is a block diagram which illustrates the prior art connection of an electromechanical pulsing relay in a rotary dial telephone circuit.

Referring now to FIG. 1, a portion of a rotary dial telephone switching circuit 10 is illustrated. In this prior art arrangement, an electromechanical pulsing relay 12 has normally closed (N.C.) contacts coupled to a vertical stepping relay 14 and normally open (N.O.) contacts coupled to a timing relay 16 for transmitting rotary dial pulses to telephone exchange selector equipment. The pulsing relay 12 is switched by an interface solenoid 18 which is connected to the plus and minus coil terminals of a 48 V.D.C. supply. The solenoid 18 is energized by the flow of current through a subscriber set 20.

As previously discussed, the condition of the telephone equipment, including the telephone transmission lines to the subscriber set and the regulation of the 48 V.D.C. supply determines the magnitude of the current which flows through the interface solenoid 18 in response to the off-hook condition at the subscriber set, or in response to the making and breaking of a circuit by dialing a number on the subscriber set. Field conditions, including equipment aging, can reduce the magnitude of the current which flows in the interface solenoid to a level below the latching current required to pull in the armature of the pulsing relay. When this occurs, the digits dialed at the subscriber set will not be received at the telephone exchange.

Figure 2:
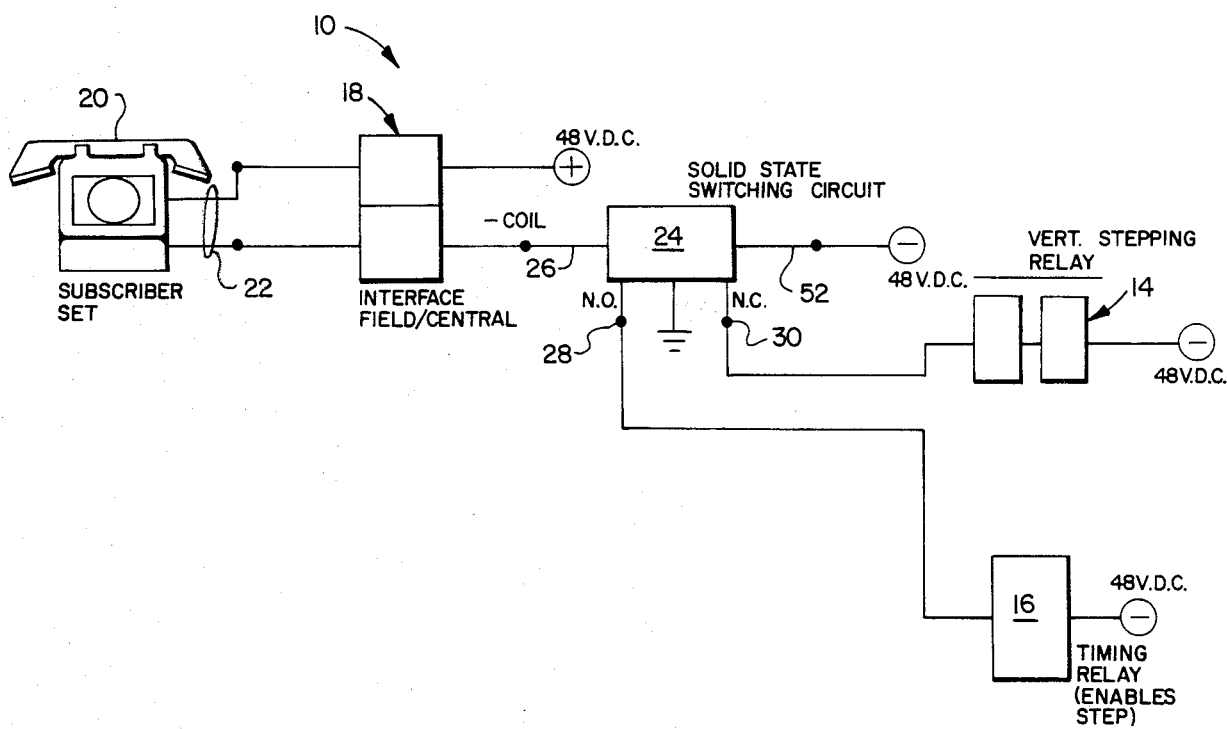
FIG. 2 is a block diagram similar to FIG. 1 which illustrates the replacement of the electromechanical pulsing relay with the solid state switching circuit of the invention; and, FIG. 3 is a schematic circuit diagram of a solid state switching circuit which is functionally interchangeable with a single pole, double throw electromechanical switch.
Figure 3:
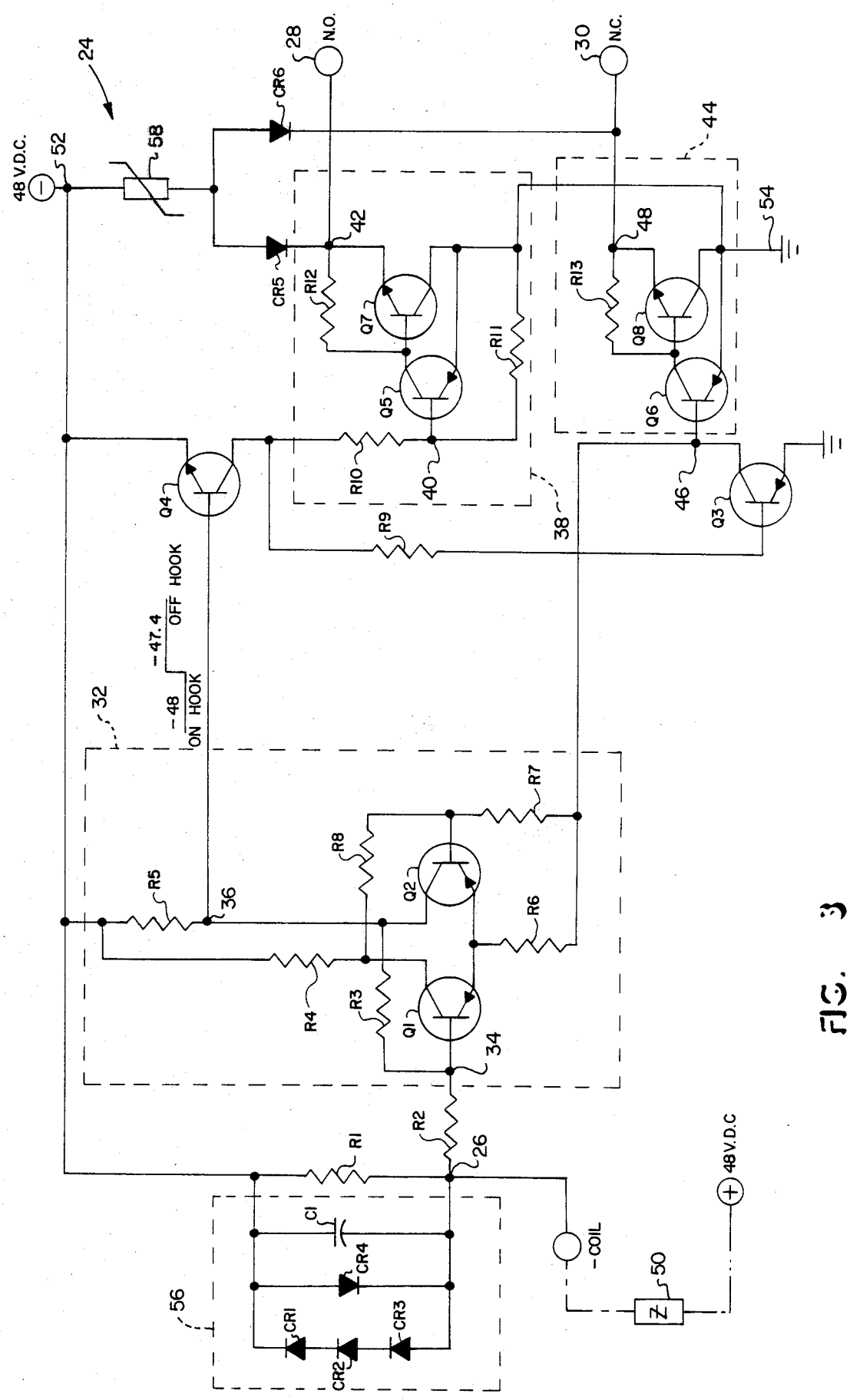

Referring now to FIGS. 2 and 3, the electromechanical pulsing relay 12 is replaced by a solid state switching circuit 24 which is connected in electrical series relation in the minus coil circuit of the interface solenoid 18. The switching circuit 24 is provided with an input sensing node 26 and normally open and normally closed output terminals 28, 30.

The principal components of the solid state switching circuit 24 are a bistable switch 32 having an input node 34 and an output node 36, a first output switching circuit 38 having an input node 40 and an output node 42, and a second output switching circuit 44 having an input node 46 and an output node 48.

The state of the output terminals 28, 30 is reversed in response to the connection of an external impedance load 50 across the input sensing terminal 26. In the arrangement shown in FIG. 3, it should be understood that the circuit is a positive ground configuration with the impedance 50 representing the impedance of the subscriber circuit and the associated transmission line 22. The impedance 50 is connected across the input sensing node 26 and the positive terminal of the 48 V.D.C. supply when the subscriber set is off hook, or when the rotary dial mechanism is engaged momentarily in circuit closed condition.

The operating states of the first and second output switching circuits 38, 44 are reversed in response to a switching signal generated by the binary switch 32. The binary switch 32 is biased off with no switch signal being produced at output 36 in the absence of an external impedance load (on hook condition) so that output terminal 28 is open and the output terminal 30 is closed. As used herein, the terms "open" and "closed" refer to relatively different voltage levels on the output nodes 42, 48, respectively. For this particular application, the output switching circuit 38 is in open circuit condition when node 42 is at or near the potential on a voltage supply node 52, and is in closed condition when the voltage on output node 42 is at or near the potential of a ground reference node 54. For most switching applications, the voltage reference levels which are switched in and out are typically zero volts or ground potential and some other voltage substantially greater than or less than the reference potential.

The bistable switch 32 selectively controls the operation of the first and second output switching circuits 38, 44 in response to the connection and disconnection of the external impedance load 50 to the input sensing node 26. The operating states of the first and second output switching circuits 38, 44 are reversed in response to a switching signal generated by the binary switch 32. The binary switch 32 is biased off with no switching signal being produced in the absence of an external impedance load so that output terminal 28 is open and output terminal 30 is closed. When the external impedance load 50 is connected to the sensing node 26, the switching signal is generated, thereby reversing the operating states of the output switching circuits.

Referring now to FIG. 3, and assuming that the subscriber set is in the on-hook condition, the subscriber circuit is open and the impedance load 50 is disconnected from the input sensing node 26. In the on-hook condition, Q1 is on and Q2 is off, whereby output node 36 is at −48 V.D.C. Q4 is turned off with the same potential on its base and emitter. However, Q6 in output switching circuit 44 is turned on with its base emitter junction being forward biased, with its emitter being at ground potential and its base being negative. The emitter of Q1 is biased toward ground potential by R6 so that the emitter base junction of Q1 is forward biased in the on condition.

The resistance values of R2, R3, R4, R6, R7 and R8 are carefully selected so that Q2 is biased off when Q1 is conducting.

Q4 is a base current driver switch which conducts base current for Q5 in switching circuit 38 and Q3 connected to switching circuit 44. In the on-hook condition, Q4 is turned off so that no base current is conducted to input switching circuit 38. Consequently, the base and emitter of Q5 are at ground potential and Q5 is turned off. With Q5 turned off, Q7 is also turned off and the −48 V.D.C. supply voltage appears at the output node 42 and at the output terminal 28.

With Q4 turned off, Q3 is also turned off. However, Q6 is conducting as previously discussed. With Q6 turned on, the emitter base junction of Q8 is forward biased with its base being substantially at ground potential. Thus, Q8 is turned on and is conducting heavily. Neglecting the voltage drop from the emitter to collector of Q8, the output node 48 is substantially at ground potential, whereby output terminal 30 is in the closed state.

For the off-hook condition, an impedance load 50 is connected to the input sensing node 26. When this occurs, the potential on input sensing node 26 and the potential on input node 34 of the bistable switch 32 both rise toward the ground reference potential. At a level determined by resistors R2, R3, R4, R6, R7, R8 and the 48 volt supply, Q1 turns off and Q2 turns on. To make certain that Q1 turns off and Q2 turns on sharply in response to the flow of current through input sensing node 26, which would correspond with the condition that an external impedance load 50, less than the desired maximum loop operating impedance, is connected to the input sensing node 26, resistors R3 and R8 provide positive feedback to transistors Q2 and Q1, respectively. By this arrangement, positive state reversal occurs only when the value of the external impedance falls below a designed maximum value, for example 2500 ohms loop resistance, thereby rendering the switching circuit relatively insensitive to the condition of the equipment to which it is attached, especially leakage conditions.

In the embodiment shown in FIG. 3, the input voltage limiting function is provided by stacked diodes CR1, CR2 and CR3 which are coupled between the voltage supply node 52 and the input sensing node 26 in series electrical, forward biased relation. The voltage drop across the stacked diodes is relatively constant with respect to current flow, whereby the input sensing node 26, and the input node 34 cannot exceed a fixed bias voltage. In this instance, the combined voltage drop across the stacked diodes CR1, CR2 and CR3 is equal to 1.8 volts. This circuit 56 protects Q1 against reverse emitter-base breakdown in low impedance line installations.

Circuit 32 is a voltage comparison circuit with positive feedback to provide hysterisis and fast switching characteristics. In this circuit, the voltage at input node 34 is compared with the voltage present at the base of Q2. Thus voltage is referenced to the voltage on node 52 and is typically in the range of 1 volt as determined by R4, R8 and R7. Current flowing through the load impedance also flows through and developes a voltage across resistor R1, referenced to voltage node 52. The value of R1 is so chosen that when the impedance of external load 50 is equal to the maximum desired operating impedance, the voltage at input node 34 is relatively more positive than the voltage at the base of Q2.

If the load impedance is greater than the desired operating impedance, and the voltage at input 34 is more negative than that at the base of Q2 for the case where the load impedance is absent and no line leakage is present, essentially no voltage is developed across R1. Consequently, input 34 is more negative than the base of Q2 causing Q1 to be turned on and Q2 to be turned off. When Q1 is turned on and Q2 off, current flowing through R6 and R7 will cause switching circuit 44 to be on. Since Q2 is off, there is no current flow to the base of Q4. Therefore, Q4 does not conduct so switching circuit 38 is off.

When the impedance of load 50 falls below the design level, the voltage developed across R1 rises to the point where input node 34 is more positive than the base of Q2, and switching action occurs. As the base of Q1 goes more positive than the base of Q2, Q2 begins to conduct thereby increasing the voltage developed across R5. This increase is fed back to the base of Q1 by R3 to reinforce the positive voltage and cause Q1 to rapidly turn off, forcing Q2 on. Similarly, additional positive feedback is provided to the base of Q2 by R8. Once this switching action has occured in circuit 32 the voltage at the base of Q2 is decreased since Q1 is no longer causing current to flow through R4.

To cause the switching circuit to revert to its original state, load impedance 50 must increase to a value noticeably greater than that required to initially operate the circuit. This hysteresis is essential to proper operation of the circuit. Without hysteresis, the circuit could have unstable output states for levels of load impedance near the operating level.

Resistor R1 primarily sets the operating level, and R2 through R8 determine the hysterisis characteristics. Values are chosen such that with Q1 conducting the voltage across R4 and R8 would be approximately 1 volt and with Q2 conducting the voltage across R4 and R8 would be approximately 0.9 volts, typically. The value of R1 is then chosen such that the circuit switches outputs 28 on and 30 off when the load impedance 50 causes a desired level of current to flow through R1 and the circuit would switch back to its previous state when the current falls below that level by the desired hysterisis amount.

When Q4 turns on, a negative voltage appears at the base of Q3. Since the emitter of Q3 is at ground reference potential, the emitter base junction of Q3 is forward biased and Q3 turns on. This drives the input node 46 of switching circuit 44 substantially to ground potential, thereby turning off Q6. With Q6 turned off, current is no longer supplied to the base of Q8, whereby Q8 is also turned off. In this condition, output node 48 is substantially at −48 V.D.C., and output terminal 30 is in open circuit condition and its operating state is reversed.

The operating state of switching circuit 38 is also reversed when Q4 turns on. With Q4 turned on, base current is conducted through R10 and R11 to the ground reference node 54. A negative voltage appears at the base of Q5 with ground potential at the emitter of Q5 which forward biases the emitter base junction of Q5, thereby turning Q5 on. With Q5 on, the base of Q7 is substantially at ground potential (neglecting the collector-emitter drop across Q5), thereby forward biasing the emitter base junction of Q7. Q7 turns on and conducts heavily, which drives output node 42 substantially to ground reference potential. As this occurs, the state of output terminal 28 reverses to the closed state condition. Thus, in response to the application of the external impedance load 50 to the input sensing node 26, the switching signal is conducted through output node 36, thereby reversing the oprating states of the output switching circuits. The operating state of the output terminals is reversed again when the external load 50 is disconnected from the input sensing node.

Operation of the circuit 24 may also be described in terms of functioning with a load impedance which is always present (as is the case with line leakage). When the load impedance falls below that value designed as the maximum loop impedance (off hook condition), the circuit operates, reversing the states of 28 and 30 and when the impedance returns to leakage condition (on hook condition), 28 and 30 revert to their former states.

High amplitude switching transients which appear on the output terminals 28, 30 are suppressed by a varistor 58 which is coupled between the supply voltage node 52 and the output nodes 42, 48 through diodes CR5 and CR6. The varistor 58 is a voltage dependent, non-linear resistor having an electrical characteristic similar to a back-to-back combination of two Zener diodes. The varistor provides a symmetrical, sharp breakdown characteristic which suppresses transients. When exposed to high voltage transients, the varistor impedance changes several orders of magnitude from a near open circuit to a highly conductive level, thus clamping the transient voltage to a safe level. Thus, the potentially destructive energy of a transient pulse is absorbed by the varistor 58, thereby protecting the output switching circuits 38, 44.

Diode CR4 protects the bistable switch from reverse voltage spikes propagated through the external tip/ring circuit. Capacitor C1 of circuit 56 serves as a transient filter and as a by-pass for reducing longitudinal circuit imbalance.

Although a preferred embodiment of the invention has been described in detail, it should be understood that various changes, substitutions and alterations can be made therein without departing from the spirit and scope of the invention as defined by the appended claims.

What is claimed is:

1. A pulse receiver circuit having a sensing node, a voltage supply node and a ground reference node, and first and second output nodes having a first operational state of being normally open circuit and normally closed circuit, respectively, and having a second operational state that is reversed in response to the connection of an external impedance load to the sensing node, said circuit comprising, in combination:
   a bistable switching circuit having an input node coupled to said sensing node and having a switching signal node, said switching signal node being at a first potential defining a first operating state and at a second potential defining a second operating state when the external impedance load is disconnected from and connected to said sensing node, respectively;
   a first output switching circuit having a gate input coupled to the switching signal node of said bistable switching circuit and having a gate controlled output circuit coupled to the first output node, said gate controlled output circuit being open when said bistable switching circuit is in said first operating state and being closed when said bistable switching circuit is in said second operating state;
   a second output switching circuit having a gate input coupled to the switching signal node of said bistable switching circuit and having a gate controlled output circuit coupled to the second output node, said gate controlled output circuit being closed when said bistable switching circuit is in said first operating state and being open when said bistable switching circuit is in said second operating state;
   the first and second output nodes being at the voltage supply node potential and at the ground reference node potential, respectively, in the first operating state of the bistable switching circuit, and the first and second output nodes being at the ground reference node potential and at the voltage supply node potential, respectively, in the second operating state of the bistable switching circuit;
   voltage bias means coupled to said sensing node for placing said bistable switching circuit in the second state when the external impedance load is connected to said sensing node, and for placing said bistable switching circuit in the first state when the external impedance load is disconnected from said sensing node; and,
   input voltage limiting means coupled between the voltage supply node and the sensing node for maintaining said sensing node at a predetermined bias voltage level corresponding with operation of said bistable switching circuit in the second operating state in response to current flow from said sensing node through the external impedance load.

2. A switching circuit as defined in claim 1, said input voltage limiting means comprising a plurality of series connected diodes.

3. A receiver circuit according to claim 1 wherein said voltage bias means is further coupled to said bistable switching circuit to provide positive feedback when a transition of operating states occurs.

4. A receiver circuit according to claim 1 further including a high amplitude switching transient protection means connected to said first and second output nodes and to said voltage supply node for protecting the bistable switching circuit from transient voltage at the first and second output nodes.

5. A relay circuit having a sensing node and normally open and normally closed output nodes, wherein states of the output nodes are reversed in response to the connection of an external impedance load to the sensing node, said relay circuit comprising, in combination:
   a bistable switching circuit having a gate input coupled to the sensing node and having an output node for conducting a switching signal thereto in response to the connection of the external impedance load to the sensing node, said bistable switching circuit having a first operating state in which said switching signal is enabled and a second operating state in which said switching signal is inhibited;
   a first output switching circuit having a gate input coupled to the output node of said bistable switching circuit and having an output coupled to the normally open output node, said first output switching circuit being open in the absence of said switching signal and being closed in response to the presence of said switching signal;
   a second output switching circuit having a gate input coupled to the output node of said bistable switching circuit and having an output coupled to the normally closed output node, said second output switching circuit being closed in the absence of said switching signal and being open in response to the presence of said switching signal;
   voltage bias means coupled to said bistable switching circuit gate input for placing said bistable switching circuit in the second state when the external impedance load is connected to said sensing node, and for placing said bistable switching circuit in the first state when the external impedance load is disconnected from said sensing node; and,
   input voltage limiting means coupled between a voltage supply node and the sensing node for maintaining said sensing node at a predetermined bias voltage level corresponding with operation of said bistable switching circuit in the second operating state in response to current flow from said sensing node through the external impedance load.

6. A relay circuit according to claim 5 wherein said voltage bias means is further coupled to said bistable switching circuit to provide positive feedback when a transition of said first and second operating states occurs.

7. In a load responsive switching device having a load sensing node, a supply voltage node, and a ground reference node, a bistable switching circuit having an input node coupled to said load sensing node and having first and second output nodes, the bistable switching circuit having first and second operating states wherein the first and second output nodes are placed at the supply voltage node potential and at the ground reference node potential, respectively, in the first operating state of the bistable switching circuit, and the first and second output nodes are placed at the ground reference node potential and at the supply voltage node potential, respectively, in the second oerating state of the bistable switching circuit, and voltage bias means coupled to said sensing node for placing said bistable switching circuit in the second operating state when an external impedance load is connected to said sensing node, and for placing said bistable switching circuit in the first operating state when the external impedance load is disconnected, the improvement comprising:
  a voltage input limiter circuit coupled between the supply voltage node and the load sensing node for clamping the load sensing node at a bias voltage level corresponding with operation of said bistable switching circuit in its second operating state in response to current flow from said sensing node through an external impedance load having an impedance magnitude less than a predetermined maximum operative level.

8. A load responsive switching device as defined in claim 7, said voltage input limiter circuit comprising a diode and a resistor, said diode being connected in parallel electrical relation with said resistor, the parallel connected diode and resistor being coupled in forward biased relation between the supply voltage node and the load sensing node.

9. A switching circuit having a voltage supply node, a ground reference node, a sensing node and normally open and normally closed output nodes, wherein the states of the output nodes are reversed in response to the connection of an external impedance load to the sensing node, said switching circuit comprising, in combination:
  a bistable switching circuit having an input node coupled to said sensing node and having first and second output nodes, said first output node being at supply node potential and at ground reference potential when the external impedance load is disconnected from and connected to said sensing node, respectively, and said second output node being at ground reference potential and at supply node potential when the external impedance load is disconnected from and connected to said sensing node, respectively;
  the first and second output nodes being at supply node potential and at ground reference potential, respectively, defining a first operating state, and the first and second output nodes being at ground reference potential and at supply node potential, respectively, defining a second operating state;

voltage bias means coupled to said input node for placing said bistable switching circuit in the second operating state when an external impedance load is connected to said sensing node, and for placing said bistable switching circuit in the first operating state when the external impedance load is disconnected; and,
  input voltage limiting means coupled between the voltage supply node and the sensing node for maintaining said sensing node at a predetermined bias voltage level corresponding with operation of said bistable switching circuit in the second operating state in response to current flow from said sensing node through the external impedance load.

10. An electronic switch for use in the tip and ring circuit of a rotary dial telephone pulsing system as a functional replacement for a single pole, double throw electromechanical pulsing relay comprising, in combination:
  a bistable switching circuit having an input sensing node and a supply voltage node for connection in series electrical relation in the tip and ring circuit wherein an external impedance load is connected across said input sensing node in response to operation of an on-line subscriber set, and having a first output terminal which is at supply node potential and at ground reference potential when the external impedance load is disconnected from and connected to said sensing node, respectively, and having a second output terminal which is at ground reference potential and at supply node potential when the external impedance load is disconnected from and connected to said sensing node, respectively, the first and second output terminals being at supply node potential and at ground reference potential, respectively, defining a first operating state, and the first and second terminals being at ground reference potential and at supply node potential, respectively, defining a second operating state;
  voltage bias means coupled to said bistable switching circuit for placing said bistable switching circuit in the second operating state when the external impedance load is connected to said sensing node, and for placing said bistable switching circuit in the first operating state when the external impedance load is disconnected; and
  input voltage limiting means coupled between the supply voltage node and the sensing node for clamping said sensing node at a predetermined bias voltage level corresponding with operation of said bistable switch in the second operating state in response to current flow from said sensing node through the external impedance load.

11. A switching circuit having a sensing node and normally open and normally closed output nodes, wherein the states of the output nodes are reversed in response to the connection of an external impedance load to the sensing node, said switching circuit comprising, in combination:
  a bistable switching circuit having an input node coupled to the sensing node and having an output node for conducting a switching signal is response to the connection of the external impedance load to the sensing node, said bistable switching circuit having a first operating state in which said switching signal is enabled and a second operating state in which said switching signal is inhibited;

a first output switching circuit having an input node coupled to the output node of said bistable switching circuit and having an output coupled to the normally open output node, said first output switching circuit being open in the absence of said switching signal and being closed in response to the presence of said switching signal;

a second output switching circuit having an input node coupled to the output node of said bistable switching circuit and having an output coupled to the normally closed output node, said second output switching circuit being closed in the absence of said switching signal and being open in response to the presence of said switching signal; and, voltage bias means coupled to said bistable switching circuit input node for placing said bistable switching circuit in its first operating state when the external impedance load is connected to said sensing node, and for placing said bistable switch in its second operating state when the external impedance load is disconnected.

* * * * *